United States Patent [19]
Liu et al.

[11] Patent Number: 6,054,390
[45] Date of Patent: Apr. 25, 2000

[54] GRAZING INCIDENT ANGLE PROCESSING METHOD FOR MICROELECTRONICS LAYER FABRICATION

[75] Inventors: Erzhuang Liu; Yih-Shung Lin; Charles Lin, all of Singapore, Singapore

[73] Assignee: Chartered Semiconductor Manufacturing Ltd., Singapore, Singapore

[21] Appl. No.: 08/964,810

[22] Filed: Nov. 5, 1997

[51] Int. Cl.[7] .................... H01L 21/302; H01L 21/461
[52] U.S. Cl. ................... 438/706; 438/707; 438/723
[58] Field of Search .................... 438/733, 700, 438/707, 706, 734, 710, 723; 118/723 E, 723 I

[56] References Cited

U.S. PATENT DOCUMENTS

| | | | |
|---|---|---|---|
| 5,192,697 | 3/1993 | Leong | 437/37 |
| 5,366,910 | 11/1994 | Ha et al. | 437/40 |
| 5,370,779 | 12/1994 | Ohba et al. | 204/192.34 |
| 5,459,086 | 10/1995 | Yang | 437/35 |
| 5,531,834 | 7/1996 | Ishizuka et al. | 118/723 I |
| 5,549,786 | 8/1996 | Jones et al. | 438/723 |
| 5,792,705 | 8/1998 | Wang et al. | 438/723 |
| 5,837,613 | 11/1998 | Kalnitsky et al. | 438/723 |
| 5,849,637 | 12/1998 | Wang | 438/700 |
| 5,849,640 | 12/1998 | Hsia et al. | 438/734 |

*Primary Examiner*—Benjamin L. Utech
*Assistant Examiner*—Duy-Vu Deo
*Attorney, Agent, or Firm*—George O. Saile; Rosemary L.S. Pike; Alek P. Szecsy

[57] ABSTRACT

A method for fabricating a microelectronics fabrication. There is first provided a substrate employed within a microelectronics fabrication. There is then formed horizontally spaced over the substrate a plurality of patterned microelectronics structures. There is then formed over the substrate and the plurality of patterned microelectronics structures a microelectronics layer. The microelectronics layer has a first region of the microelectronics layer interposed between the plurality of patterned microelectronics structures and a second region of the microelectronics layer not interposed between the plurality of microelectronics structures. Finally, there is processed through a grazing angle method the microelectronics layer, where the grazing angle method processes substantially all of the second region of the microelectronics layer without substantially processing the first region of the microelectronics layer. There is also disclosed a apparatus through which may be practiced the grazing angle method, where the apparatus employs a charged particle beam within the grazing angle method and where the charged particle beam is spirally magnetically constrained by a magnetic field perpendicular to the substrate.

11 Claims, 4 Drawing Sheets

GRAZING INCIDENT ANGLE PROCESSING METHOD FOR MICROELECTRONICS LAYER FABRICATION

BACKGROUND OF THE INVENTION

1. Field of the Invention

The present invention relates generally to methods for fabricating microelectronics layers within microelectronics fabrications. More particularly, the present invention relates to selective methods for fabricating microelectronics layers within microelectronics fabrications.

2. Description of the Related Art

As microelectronics integration levels have increased and microelectronics device and conductor element dimensions have decreased, it has become increasingly important within advanced microelectronics fabrications to form within advanced microelectronics fabrications high areal density patterned conductor layers (ie: patterned conductor layers having linewidth and pitch dimensions of less than about 0.40 microns) which have interposed between their patterns low dielectric constant dielectric layers. High areal density patterned conductor layers which have interposed between their patterns within advanced microelectronics fabrications low dielectric constant dielectric layers are desirable since there may then be fabricated within those advanced microelectronics fabrications electronics circuits which exhibit attenuated electronics circuit cross-talk, increased electronics circuit speed and other desirable electronics circuit properties.

While high areal density patterned conductor layers which have interposed between their patterns within advanced microelectronics fabrications low dielectric constant dielectric layers are thus desirable within the art of advanced microelectronics fabrication, fabrication of those low dielectric constant dielectric layers interposed between the patterns of high areal density patterned conductor layers within advanced microelectronics fabrications nonetheless presents practical problems within advanced microelectronics fabrication. In particular, it is known in the art of microelectronics fabrication that low dielectric constant dielectric materials from which may be formed low dielectric constant dielectric layers are typically either: (1) aerogel materials, or (2) materials which have a substantial organic content, such as but not limited to organic polymer materials and organo-functional siloxane spin-on-glass (SOG) materials. While the presence of such aerogel materials, organic polymer materials or organo-functional siloxane spin-on-glass (SOG) materials is desirable interposed between the patterns of high areal density patterned conductor layers within an advanced microelectronics fabrication, their presence is typically undesirable within locations other than those interposed between the patterns of high areal density patterned conductor layers within an advanced microelectronics fabrication, since such aerogel materials, organic polymer materials or organo functional siloxane spin-on-glass (SOG) materials typically also have in addition to low dielectric constants moisture sorbtion characteristics and other physical characteristics which compromise the reliability or functionality of a microelectronics fabrication within which is formed a low dielectric constant dielectric layer from an aerogel material, an organic polymer material or an organo-functional siloxane spin-on-glass (SOG) material.

It is thus desirable within the art of microelectronics fabrication to provide methods and materials through which there may be formed selectively interposed between the high areal density patterns of a high areal density patterned conductor layer a low dielectric constant dielectric layer while avoiding forming additional regions of the low dielectric constant dielectric layer upon portions of the microelectronics fabrication other than those interposed between the high areal density patterns of the high areal density patterned conductor layer. It is towards that goal that the present invention is specifically directed.

In a more general sense, it is also desirable within the art of microelectronics fabrication to provide methods and materials through which there may be formed selectively interposed between a plurality of horizontally closely spaced (ie: horizontal separation distance of less than about 0.40 microns) patterned microelectronics structures within a microelectronics fabrication a first region of an overlying microelectronics layer while avoiding forming an additional second region of the overlying microelectronics layer upon a portion of the microelectronics fabrication other than the first region interposed between the plurality of horizontally closely spaced patterned microelectronics structures. It is towards that goal that the present invention is more generally directed.

Various novel methods have been disclosed in the art of microelectronics fabrication for forming microelectronics layers, such as but not limited to low dielectric constant spin-on-glass (SOG) dielectric layers, within microelectronics fabrications. For example, U.S. Pat. No. 5,192,697 to Leong discloses an ion implantation method for curing a spin-on-glass (SOG) dielectric layer within an integrated circuit microelectronics fabrication. In comparison with conventional thermal curing methods, the ion implantation curing method provides a spin-on-glass (SOG) dielectric layer with a reduced concentration of entrapped gases remaining therein.

Similarly, U.S. Pat. No. 5,459,086 to Yang discloses an analogous ion implantation method for modifying within an integrated circuit microelectronics fabrication exposed spin-on-glass (SOG) dielectric layer sidewall surfaces within a via formed through a spin-on-glass (SOG) dielectric layer within the integrated circuit microelectronics fabrication. The ion implantation method employs a tilt angle with respect to the spin-on-glass (SOG) dielectric layer to provide exposed spin-on-glass (SOG) dielectric layer sidewall surfaces which are modified to attenuate moisture sorbtion and outgassing which would otherwise impede formation of a low resistance metal conductor stud layer within the via.

In addition, U.S. Pat. No. 5,366,910 to Ha et al. discloses a method for fabricating within an integrated circuit microelectronics fabrication a thin film transistor (TFT) having a spin-on-glass (SOG) layer formed thereover, where the spin-on-glass (SOG) layer is subsequently treated with an oxygen plasma. The oxygen plasma treatment of the spin-on-glass (SOG) layer increases the hydrogen content within the spin-on-glass (SOG) layer, thus stabilizing through hydrogen diffusion a polysilicon layer employed within the channel region of the thin film transistor (TFT).

Finally, U.S. Pat. No. 5,370,779 to Ohba et al. discloses an electron cyclotron resonance (ECR) plasma method for fabricating a microelectronics layer within a microelectronics fabrication, where the electron cyclotron resonance (ECR) plasma method employs a rotating magnetic field either parallel, perpendicular or both parallel and perpendicular to a microwave propagation direction within an electron cyclotron resonance (ECR) plasma employed within the electron cyclotron resonance (ECR) plasma method. Within the method, an ion beam derived from the electron cyclotron resonance (ECR) plasma is converged in part by applying a pulse voltage to the rotating magnetic field, thus providing an electron cyclotron resonance (ECR) plasma method through which the microelectronics layer may be precisely patterned.

Desirable within the art of microelectronics fabrication are methods and materials through which there may be formed selectively interposed between a plurality of horizontally closely spaced patterned microelectronics structures within a microelectronics fabrication a first region of an overlying microelectronics layer while avoiding forming an additional second region of the overlying microelectronics layer upon portions of the microelectronics fabrication other than those interposed between the plurality of horizontally closely spaced patterned microelectronics structures. More particularly desirable within the art of microelectronics fabrication are methods and materials through which there may be formed selectively interposed between the patterns of a high areal density patterned conductor layer a low dielectric constant dielectric layer while avoiding forming additional regions of the low dielectric constant dielectric layer upon portions of the microelectronics fabrication other than those interposed between the high areal density patterns of the high areal density patterned conductor layer. It is towards the foregoing goals that the present invention is both generally and specifically directed.

SUMMARY OF THE INVENTION

A first object of the present invention is to provide a method for forming over a microelectronics substrate within a microelectronics fabrication interposed between a plurality of horizontally closely spaced patterned microelectronics structures a first region of an overlying microelectronics layer while avoiding forming an additional second region of the overlying microelectronics layer upon a portion of the microelectronics fabrication other than the first region interposed between the plurality of horizontally closely spaced patterned microelectronics structures.

A second object of the present invention is to provide a method in accord with the first object of the present invention, where the microelectronics fabrication is an integrated circuit microelectronics fabrication, the plurality of horizontally closely spaced patterned microelectronics structures is a plurality of high areal density patterns within a high areal density patterned conductor layer within the integrated circuit microelectronics fabrication and the overlying microelectronics layer is a low dielectric constant dielectric layer formed within the integrated circuit microelectronics fabrication interposed between the plurality of high areal density patterns of the high areal density patterned conductor layer.

A third object of the present invention is to provide a method in accord with the first object of the present invention or the second object of the present invention, which method is readily manufacturable.

In accord with the objects of the present invention, there is provided by the present invention a method for fabricating a microelectronics fabrication. To practice the method of the present invention, there is first provided a substrate employed within a microelectronics fabrication. There is then formed over the substrate a plurality of horizontally closely spaced patterned microelectronics structures. There is then formed over the substrate and the plurality of horizontally closely spaced patterned microelectronics structures a microelectronics layer, where the microelectronics layer has a first region of the microelectronics layer interposed between the plurality of horizontally closely spaced microelectronics structures and the microelectronics layer has a second region of the microelectronics layer formed over the substrate at a region not interposed between the plurality of horizontally closely spaced microelectronics structures. Finally, there is processed through a grazing angle method the microelectronics layer, where the grazing angle method processes substantially all of the second region of the microelectronics layer without substantially processing the first region of the microelectronics layer.

Although not limited by the method of the present invention, there is also disclosed in conjunction with the method of the present invention an apparatus employing a magnetic field perpendicular to a substrate employed within a microelectronics fabrication to spirally constrain a charged particle beam which may be employed within the grazing angle method employed within the method of the present invention.

The present invention provides a method for forming over a substrate within a microelectronics fabrication interposed between a plurality of horizontally closely spaced microelectronics structures a first region of an overlying microelectronics layer while avoiding forming an additional second region of the overlying microelectronics layer upon a portion of the microelectronics fabrication other than the first region interposed between the plurality of horizontally closely spaced patterned microelectronics structures. The method of the present invention realizes this object by employing within the method of the present invention a processing of the microelectronics layer having the first region interposed between the plurality of horizontally closely spaced patterned integrated circuit structures and the second region formed over the microelectronics substrate at regions other than those interposed between the plurality of horizontally closely spaced patterned integrated circuit structures through a grazing angle method, where the grazing angle method processes substantially all of the second region of the microelectronics layer without substantially processing the first region of the microelectronics layer.

The method of the present invention may be employed where the microelectronics fabrication is an integrated circuit microelectronics fabrication, the plurality of horizontally closely spaced patterned microelectronics structures is a plurality of high areal density patterns within a high areal density patterned conductor layer within the integrated circuit microelectronics fabrication and the overlying microelectronics layer is a low dielectric constant dielectric layer formed within the integrated circuit microelectronics fabrication interposed between the plurality of high areal density patterns within the high areal density patterned conductor layer. The method of the present invention does not discriminate with respect to the nature of the microelectronics fabrication, the microelectronics structures or the microelectronics layer which may be employed within the method of the present invention. Thus, although the method of the present invention provides substantial value when the microelectronics fabrication is an integrated circuit microelectronics fabrication, the plurality of horizontally closely spaced patterned microelectronics structures is a plurality of horizontally closely spaced patterns within a high areal density patterned conductor layer within the integrated circuit microelectronics fabrication and the microelectronics layer is a low dielectric constant dielectric layer formed interposed between the high areal density patterns of the high areal density patterned conductor layer within the integrated circuit microelectronics fabrication, the method of the present invention may be employed where: (1) the microelectronics fabrication is chosen from the group of microelectronics fabrications including but not limited to integrated circuit microelectronics fabrications, solar cell microelectronics fabrications, ceramic substrate microelectronics fabrications and flat panel display microelectronics fabrications, having formed therein; (2) a plurality of horizontally closely spaced microelectronics structures chosen from the group of microelectronics structures consisting of microelectronics conductor structures, microelectronics semiconductor structures and microelectronics insulator structures; and (3) the microelectronics layer formed interposed between the plurality of horizontally closely spaced microelectronics structures is chosen from the group of microelectronics layers including but not limited to microelectronics conductor layers, microelectronics semiconductor layers and microelectronics dielectric layers.

The method of the present invention is readily manufacturable. Since as disclosed within the Description of the Related Art angular methods for processing microelectronics layers are generally known in the art of microelectronics fabrication, and since within the Description of the Preferred Embodiment there is disclosed a specific grazing angle method and apparatus which may be employed within the method of the present invention, the method of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
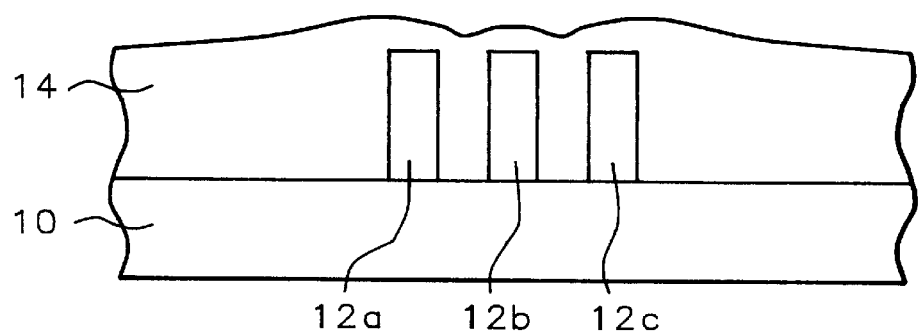
FIG. 1 to FIG. 3 show a series of schematic cross-sectional diagrams illustrating the results of progressive stages of forming within a microelectronics fabrication, in accord a general preferred embodiment of the present invention which comprises a first preferred embodiment of the present invention, interposed between a plurality of horizontally closely spaced microelectronics structures a first region of an overlying microelectronics layer while avoiding forming an additional second region of the overlying microelectronics layer upon portions of the microelectronics fabrication other than those interposed between the plurality of horizontally closely spaced microelectronics structures.

The present invention provides a method for forming within a microelectronics fabrication interposed between a plurality of horizontally closely spaced microelectronics structures a first region of an overlying microelectronics layer while avoiding forming an additional second region of the overlying microelectronics layer upon a second portion of the microelectronics fabrication in a location other than interposed between the plurality of horizontally closely spaced microelectronics structures. For reference purposes, within the method of the present invention it is assumed that the microelectronics fabrication employs a microelectronics substrate which is substantially planar and horizontal. Thus, all overlying layers and structures within the microelectronics fabrication are disclosed with reference to the horizontal and substantially planar microelectronics substrate. The method of the present invention realizes the foregoing object by employing within the method of the present invention a processing of a microelectronics layer having: (1) the first region interposed between the plurality of horizontally closely spaced microelectronics structures; and (2) a second region formed over the microelectronics substrate at a location other than the first region interposed between the plurality of horizontally closely spaced microelectronics structures, through a grazing angle method, where the grazing angle method processes substantially all of the second region of the microelectronics layer without substantially processing the first region of the microelectronics layer.

Although the method of the present invention provides substantial value when: (1) the microelectronics fabrication is an integrated circuit microelectronics fabrication; (2) the plurality of horizontally closely spaced microelectronics structures is a plurality of horizontally closely spaced patterns within a patterned conductor layer within the integrated circuit microelectronics fabrication; and (3) the microelectronics layer is a low dielectric constant dielectric layer formed interposed between the plurality of horizontally closely spaced patterns within the patterned conductor layer within the integrated circuit microelectronics fabrication, the method of the present invention may in general be employed where: (1) the microelectronics fabrication is chosen from the group of microelectronics fabrications including but not limited to integrated circuit microelectronics fabrications, solar cell microelectronics fabrications, ceramic substrate microelectronics fabrications and flat panel dieplay microelectronics fabrications having formed therein; (2) a plurality of horizontally closely spaced microelectronics structures chosen from the group of microelectronics structures consisting of microelectronics conductor structures, microelectronics semiconductor structures and microelectronics insulator structures; and (3) the microelectronics layer formed interposed between the plurality of horizontally closely spaced microelectronics structures is chosen from the group of microelectronics layers including but not limited to microelectronics conductor layers, microelectronics semiconductor layers and microelectronics dielectric layers.

First Preferred Embodiment

Figure 2:
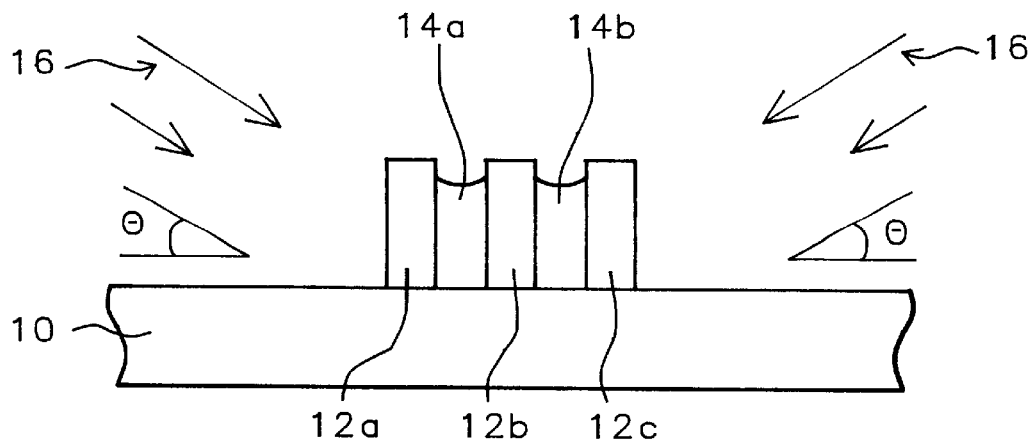
Figure 3:
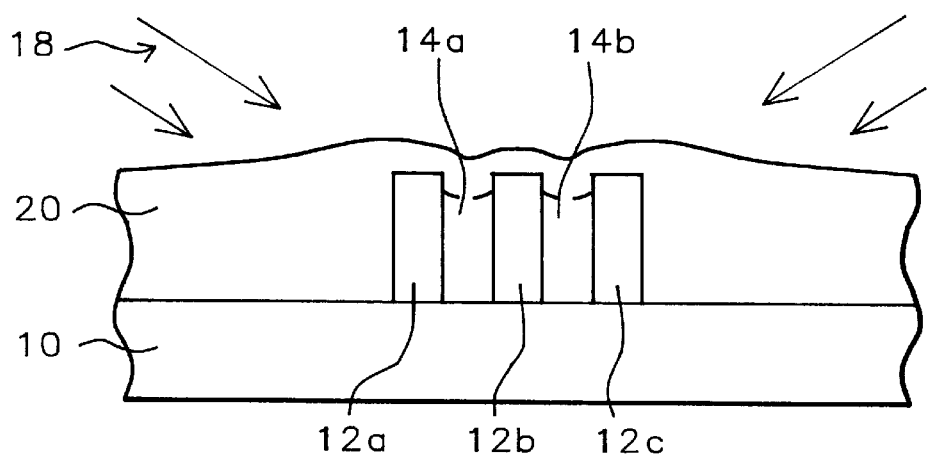

Referring now to FIG. 1 to FIG. 3, there is show a series of schematic cross-sectional diagrams illustrating the results of progressive stages of forming, within a microelectronics fabrication in accord a general preferred embodiment of the present invention which comprises a first preferred embodiment of the present invention, interposed between a plurality of horizontally closely spaced microelectronics structures a first region of an overlying microelectronics layer while avoiding forming an additional second region of the overlying microelectronics layer upon portions of the microelectronics fabrication other than those interposed between the plurality of horizontally closely spaced patterned microelectronics structures. Shown in FIG. 1 is a schematic cross-sectional diagram of the microelectronics fabrication at an early stage in its fabrication.

Shown in FIG. 1 is a substrate 10 employed within a microelectronics fabrication, where the microelectronics fabrication may be chosen from the group of microelectronics fabrications including but not limited to integrated circuit microelectronics fabrications, solar cell microelectronics fabrications, ceramic substrate microelectronics fabrications and flat panel display microelectronics fabrications. Within FIG. 1 the substrate 10 is intended to represent either: (1) the substrate alone as employed within the microelectronics fabrication; or (2) the substrate as employed within the microelectronics fabrication, where the substrate has additional microelectronics layers formed thereupon or thereover. The additional microelectronics layers may include, but are not limited to, microelectronics conductor layers, microelectronics semiconductor layers and microelectronics dielectric layers.

Shown also within FIG. 1 is a plurality of horizontally closely spaced patterned microelectronics structures 12a, 12b and 12c formed upon the substrate 10. Within the first preferred embodiment of the present invention, the plurality of horizontally closely spaced patterned microelectronics structures 12a, 12b and 12c may be formed from microelectronics structures including but not limited to microelectronics conductor structures, microelectronics semiconductor structures and microelectronics dielectric structures. Although not specifically illustrated by the schematic cross-sectional diagram of FIG. 1, each of the patterned microelectronics structures 12a, 12b or 12c within the plurality of horizontally closely spaced microelectronics structures 12a, 12b and 12c preferably: (1) has a linewidth of from about 0.1 to about 0.8 microns; (2) has an aspect ratio of from about 1 to about 10; and (3) is separated from an adjoining patterned microelectronics structure 12a, 12b or 12c within the plurality of patterned microelectronics structures 12a, 12b and 12c by a pitch of from about 0.2 to about 1.6 microns.

Finally, there is shown in FIG. 1 formed over the substrate 10 and upon the plurality of horizontally closely spaced patterned microelectronics structures 12a, 12b and 12c a microelectronics layer 14, where the microelectronics layer 14 has: (1) a first region R1 containing a portion of the microelectronics layer which is interposed between the plurality of horizontally closely spaced patterned microelectronics structures 12a, 12b and 12c; and (2) a pair of second regions R2 formed over the substrate 10 at regions other than those interposed between the plurality of horizontally closely spaced patterned microelectronics structures 12a, 12b and 12c. Preferably, the microelectronics layer 14 is formed to a thickness of from about 5000 to about 20000 angstroms.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional of a microelectronics fabrication otherwise equivalent to the microelectronics fabrication whose schematic cross-sectional diagram is illustrated in FIG. 1, but wherein the portions of the microelectronics layer 14 within the pair of second regions R2 of the microelectronics layer 14 have been completely etched with a grazing angle etching beam 16 to leave remaining only the patterned microelectronics layers 14a and 14b interposed between the plurality of horizontally closely spaced patterned microelectronics structures 12a, 12b and 12c. Within the first preferred embodiment of the present invention, the grazing angle etching beam 16 may be chosen from the group of etching beams including but not limited to reactive ion etching beams and physical sputtering etching beams. The nature and composition of the grazing angle etching beam 16 is selected in accord with the nature of the materials from which are formed the microelectronics layer 14, the plurality of horizontally closely spaced patterned microelectronics structures 12a, 12b and 12c, and the substrate 10.

Within the first preferred embodiment of the present invention, where each of the plurality of horizontally closely spaced patterned microelectronics structures 12a, 12b or 12c within the plurality of horizontally closely spaced patterned microelectronics structures 12a, 12b and 12c preferably: (1) has a linewidth of from about 0.1 to about 0.8 microns; (2) has an aspect ratio of from about 1 to about 10, and (3) is separated from an adjoining horizontally closely spaced microelectronics structure by a pitch of from about 0.2 to about 1.6 microns, the incidence angle $\Theta$ of the grazing angle etching beam 16 with respect to the substrate, as illustrated in FIG. 2, is preferably from about 0 to about 70 degrees.

Referring now to FIG. 3, there is shown an alternative schematic cross-sectional diagram illustrating the results of further processing of the microelectronics fabrication whose schematic cross-sectional diagram is illustrated in FIG. 1. Show in FIG. 3 is a schematic cross-sectional diagram of a microelectronics fabrication otherwise equivalent to the microelectronics fabrication whose schematic cross-sectional diagram is illustrated in FIG. 1, but wherein the microelectronics layer 14 has been processed with a grazing angle processing beam 18 to form: (1) the patterned microelectronics layers 14a and 14b interposed between the plurality of horizontally closely spaced patterend microelectronics structures 12a, 12b and 12c; and (2) a processed microelectronics layer 20 at locations other than those interposed between the plurality of horizontally closely spaced patterned microelectronics structures 12a, 12b and 12c.

Within the first preferred embodiment of the present invention as illustrated in FIG. 3, the grazing angle processing beam 18 preferably has an incidence angle with respect to the substrate 10 equivalent to the incidence angle $\Theta$ of the of the grazing angle etching beam 16 with respect to the substrate 10, as illustrated within the schematic cross-sectional diagram of FIG. 2. Similarly, within the first preferred embodiment of the present invention as illustrated in FIG. 3, the grazing angle processing beam 18 may be a processing beam including but not limited to an ion beam, an electron beam or a radiation beam, where the grazing angle processing beam 18 is selected such that the microelectronics layer 14 upon processing with the grazing angle processing beam 18 is processed in part to the processed microelectronics layer 20 having desirable and distinct properties in comparison with the patterned microelectronics layers 14a and 14b.

Second Preferred Embodiment

Figure 4:
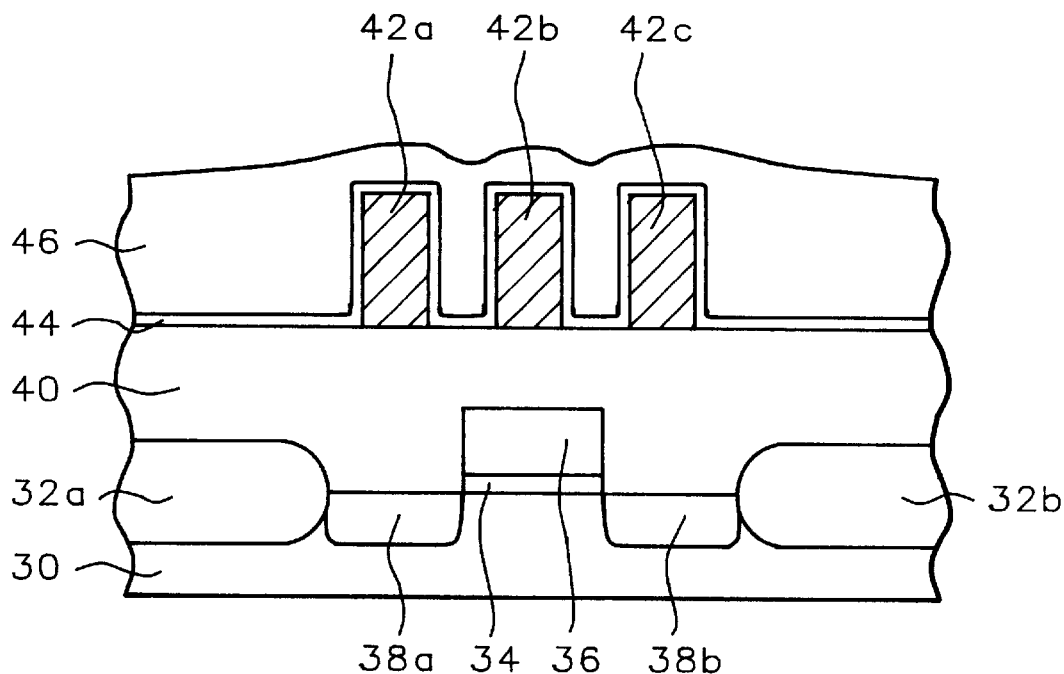
FIG. 4 to FIG. 8 show a series of schematic cross-sectional diagrams illustrating the results of progressive stages of forming within an integrated circuit microelectronics fabrication, in accord a more specific preferred embodiment of the present invention which comprises a second preferred embodiment of the present invention, interposed between a plurality of horizontally closely spaced patterns within a patterned conductor layer a first region of an overlying low dielectric constant dielectric layer while avoiding forming an additional second region of the low dielectric constant dielectric layer upon a portion of the integrated circuit microelectronics fabrication other than the region interposed between the plurality of horizontally closely spaced patterns of the patterned conductor layer.

Referring now to FIG. 4 to FIG. 8 there is shown a series of schematic cross-sectional diagrams illustrating the results of progressive stages of forming within an integrated circuit microelectronics fabrication, in accord a more specific preferred embodiment of the present invention which comprises the second preferred embodiment of the present invention, interposed between a plurality of horizontally closely spaced patterend conductor layers a first region of an overlying low dielectric constant dielectric layer while avoiding forming an additional second region of the overlying low dielectric constant dielectric layer upon portions of the microelectronics fabrication other than those interposed between the plurality of horizontally closely spaced patterned conductor layers. Shown in FIG. 4 is a schematic cross-sectional diagram of the integrated circuit microelectronics fabrication at an early stage in its fabrication.

Shown in FIG. 4 is a semiconductor substrate 30 having formed within and upon its surface a pair of isolation regions 32a and 32b which define an active region of the semiconductor substrate 30. Although it is known in the art of integrated circuit microelectronics fabrication that semiconductor substrates are available with either dopant polarity, various dopant concentrations and several crystallographic orientations, for the second preferred embodiment of the present invention the semiconductor substrate 30 is preferably a (100) silicon semiconductor substrate having an N- or P-doping.

Similarly, although it is also known in the art of integrated circuit microelectronics fabrication that isolation regions may be formed within and/or upon semiconductor substrates through methods including but not limited to isolation region thermal growth methods and isolation region deposition/patterning methods, for the second preferred embodiment of the present invention the isolation regions 32a and 32b are preferably formed within and upon the semiconductor substrate 30 to define the active region of the semiconductor substrate 30 through an isolation region thermal growth method at a temperature of from about 1000 to about 1200 degrees centigrade to form isolation regions 32a and 32b of silicon oxide within and upon the semiconductor substrate 30.

Shown also within FIG. 4 formed within and upon the active region of the semiconductor substrate 30 is a field effect transistor (FET) which comprise a series of structures including: (1) a gate dielectric layer 34 formed upon the active region of the semiconductor substrate 30, the gate dielectric layer 34 having formed and aligned thereupon; (2) a gate electrode 36; and (3) a pair of source/drain regions 38a and 38b formed within the active region of the semiconductor substrate 30 at areas not covered by the gate dielectric layer 34 and the gate electrode 36. Each of the structures within the series of structures which comprises the field effect transistor (FET) may be formed through methods and materials which are conventional in the art of field effect transistor (FET) fabrication.

For example, although it is known in the art of field effect transistor (FET) fabrication that gate dielectric layers may be formed through patterning, through methods as are conventional in the art, of blanket gate dielectric layers formed upon active regions of semiconductor substrates through methods including but not limited to blanket gate dielectric layer thermal growth methods and blanket gate dielectric layer deposition/patterning methods, for the preferred embodiment of the present invention the gate dielectric layer 34 is preferably formed through patterning, through methods as are conventional in the art, of a blanket gate dielectric layer formed through a blanket gate dielectric layer thermal growth method at a temperature of from about 800 to about 1000 degrees centigrade to form the gate dielectric layer 34 of silicon oxide of thickness about 50 to about 200 angstroms upon the active region of the semiconductor substrate 30.

Similarly, although it is also know in the art of field effect transistor (FET) fabrication that gate electrodes may be formed through patterning, through methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the gate electrode 36 is preferably formed through patterning, through methods as are conventional in the art, of a blanket layer of a doped polysilicon or polycide gate electrode material formed upon the blanket gate dielectric to a thickness of from about 1500 to about 5000 angstroms.

Finally, it is also known in the art of field effect transistor (FET) fabrication that source/drain regions are typically formed into active regions of a semiconductor substrate through ion implantation methods employing dopant ions of polarity opposite the polarity of the semiconductor substrate within which is formed those source/drain regions. For the second preferred embodiment of the present invention, the source/drain regions 38a and 38b are preferably formed within the active region of the semiconductor substrate 30 through a high dose ion implant at an ion implant dose of from about 1E15 to about 1E16 dopant ions per square centimeter and at an ion implantation energy of from about 5 to about 100 keV while employing at least the gate electrode 36 and the gate dielectric layer 34 as an ion implantation mask. The high dose ion implant is of polarity appropriate to the field effect transistor (FET) and the semiconductor substrate 30.

There is also shown within FIG. 4 formed over the semiconductor substrate 30 and the series of structures which forms the field effect transistor (FET) a planarized pre-metal dielectric (PMD) layer 40. Methods and materials through which planarized pre-metal dielectric (PMD) layers may be formed within integrated circuit microelectronics fabrications are known in the art of integrated circuit microelectronics fabrication. Planarized pre-metal dielectric (PMD) layers may be formed within integrated circuit microelectronics fabrications through methods including but not limited to chemical vapor deposition (CVD) methods, plasma enhanced chemical vapor deposition (PECVD) methods, physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 40 is preferably formed of a silicon oxide dielectric material deposited through a plasma enhanced chemical vapor deposition (PECVD) method and subsequently planarized through a chemical mechanical polish (CMP) planarizing method, as is common in the art of integrated circuit microelectronics fabrication. Other methods and materials may, however, also be employed in forming the planarized pre-metal dielectric (PMD) layer 40. Preferably, the planarized pre-metal dielectric (PMD) layer 40 so formed is formed to a thickness of from about 5000 to about 15000 angstroms over the semiconductor substrate 30 and the series of structures which forms the field effect transistor (FET).

There is also shown in FIG. 4 formed upon the planarized pre-metal dielectric (PMD) layer 40 a plurality of patterned first conductor layers 42a, 42b and 42c. Methods and materials through which patterned conductor layers may be formed within integrated circuit microelectronics fabrications are known in the art of integrated circuit microelectronics fabrication. Patterned conductor layers may be formed within integrated circuit microelectronics fabrications through patterning, through methods as are conventional in the art, of blanket conductor layers formed within integrated circuit microelectronics fabrications. The blanket conductor layers may be formed of conductor materials including but not limited to metals, metal alloys, doped polysilicon and polycides (doped polysilicon/metal silicide stacks). For the second preferred embodiment of the present invention, the plurality of patterned first conductor layers 42a, 42b and 42c is preferably formed through patterning, through methods as are conventional in the art, of a blanket first conductor layer formed at least in part of an aluminum containing conductor material, although other methods and materials may be employed in forming the plurality of patterned first conductor layers 42a, 42b and 42c.

Although not specifically illustrated within the schematic cross-sectional diagram of FIG. 4, each of the patterned first conductor layers 42a, 42b or 42c within the plurality of patterned first conductor layers 42a, 42b and 42c is preferably formed with: (1) a linewidth of from about 0.1 to about 0.8 microns; (2) an aspect ratio of from about 1 to about 10; and (3) a separation distance (ie: pitch) from an adjoining patterned first conductor layer 42a, 42b or 42c of from about 0.2 to about 1.6 microns.

Shown also within FIG. 4 formed conformally upon the exposed surfaces of the planarized pre-metal dielectric (PMD) layer 40 and the plurality of patterned first conductor layers 42a, 42b and 42c is a conformal first inter-metal dielectric (IMD) layer 44. Methods and materials through which conformal inter-metal dielectric layers may be formed within integrated circuit microelectronics fabrication are known in the art of integrated circuit microelectronics fabrication. Methods and materials through which conformal inter-metal dielectric (IMD) layers may be formed within integrated circuit microelectronics fabrications are analogous to the methods and materials through which may be formed planarized pre-metal dielectric (PMD) layers within integrated circuit microelectronics fabrications, within the exception that the conformal inter-metal dielectric (IMD) layers within integrated circuit microelectronics fabrications are not planarized. Thus, for the second preferred embodiment of the present invention, the conformal first inter-metal dielectric (IMD) layer 44 is preferably formed through methods and materials analogous or equivalent to the methods and materials through which is formed the planarized pre-metal dielectric (PMD) layer 40, with the exception that the conformal first inter-metal dielectric (IMD) layer 44 is not planarized. More preferably, the conformal first inter-metal dielectric (IMD) layer 44 so formed is formed to a thickness of from about 500 to about 2500 angstroms from a silicon oxide dielectric material deposited through a plasma enhanced chemical vapor deposition (PECVD) method.

Finally, there is shown in FIG. 4 a gap filling inter-metal dielectric (IMD) layer 46 formed upon the conformal first inter-metal dielectric (IMD) layer 44. Methods and materials through which gap filling dielectric layers may be formed within integrated circuit microelectronics fabrications are known in the art of integrated circuit microelectronics fabrication. Gap filling dielectric layers may be formed within integrated circuit microelectronics fabrications through methods including but not limited to spin-on-glass (SOG) coating methods and selected ozone assisted thermal chemical vapor deposition (CVD) methods through which may be formed gap filling dielectric layers of corresponding spin-on-glass (SOG) dielectric materials or ozone assisted thermal chemical vapor deposited (CVD) silicon oxide dielectric materials. For the second preferred embodiment of the present invention, the gap filling dielectric layer 46 is preferably formed from an organo functional siloxane spin-on-glass (SOG) dielectric material deposited through a spin-on-glass (SOG) coating and curing method, as is common in the art of integrated circuit microelectronics fabrication, to form the gap filling dielectric layer 46 of an inherently low dielectric constant organo functional siloxane spin-on-glass (SOG) dielectric material. Typically and preferably, the gap filling inter-metal dielectric (IMD) layer 46 so formed is formed to a thickness of from about 10000 to about 25000 angstroms and with a dielectric constant of from about 2.0 to about 4.0.

Figure 5:
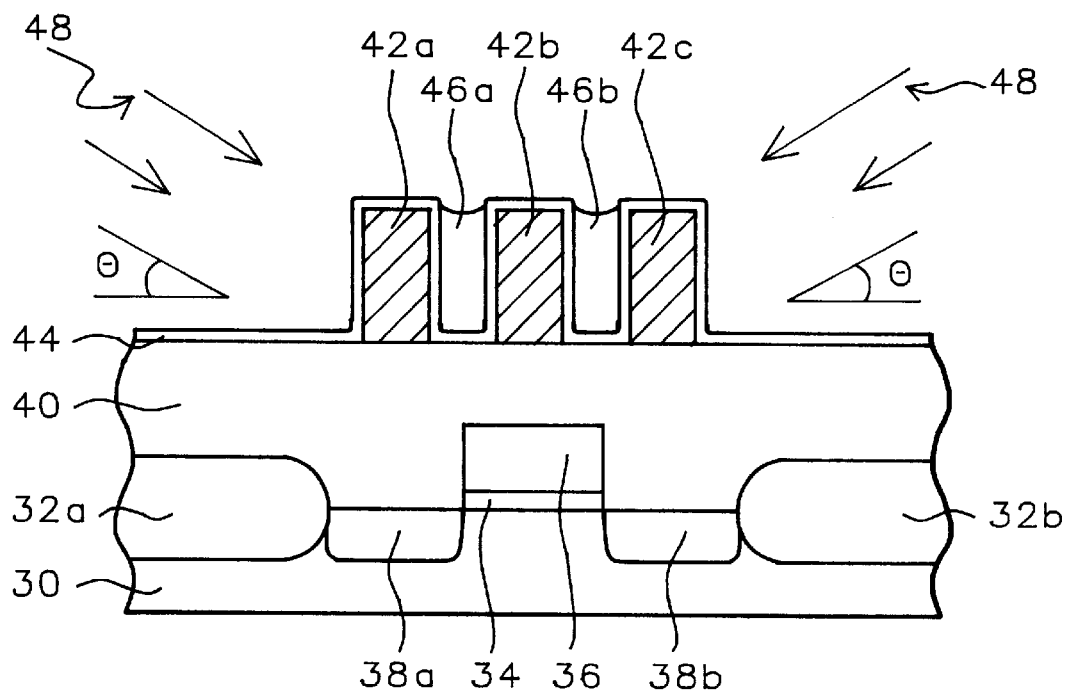

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein portions of the gap filling inter-metal dielectric (IMD) layer 46 other than those interposed between the plurality of patterned first conductor layers 42a, 42b and 42c are removed from the integrated circuit microelectronics fabrication through etching with a grazing angle etching beam 48 to leave remaining interposed between the plurality of patterned first conductor layers 42a, 42b and 42c a pair of patterned gap filling inter-metal dielectric (IMD) layers 46a and 46b.

Within the second preferred embodiment of the present invention, where the gap filling dielectric layer 46 is preferably formed of an organo functional siloxane spin-on-glass (SOG) dielectric material, the grazing angle etching beam 48 preferably comprises charged etching particles which preferentially etch the material from which is formed the gap filling inter-metal dielectric (IMD) layer 46 with respect to the material from which is formed the conformal first inter-metal dielectric (IMD) layer 44. Such charged etching particles will typically include charged fluorine containing etching ions derived from fluorocarbon etchant gas containing plasmas derived from fluorocarbon etchant gases such as but not limited to carbon tetrafluoride, trifluoromethane, and hexafluoroethane. Similarly with the grazing angle etching beam 16 within the microelectronics fabrication whose schematic cross-sectional diagram is illustrated in FIG. 2, the grazing angle etching beam 48 within the integrated circuit microelectronics fabrication whose schematic cross-sectional diagram is illustrated in FIG. 5 is preferably incident at an angle $\Theta$ of from about 0 to about 70 degrees with respect to the semiconductor substrate 30, as illustrated in FIG. 5.

Figure 6:
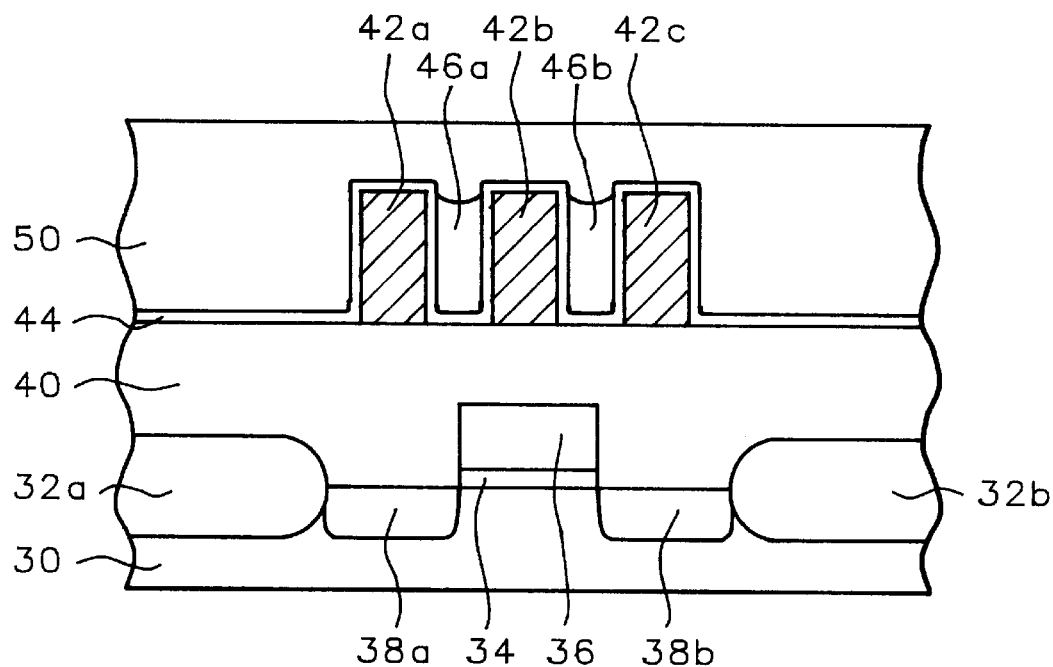

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein there has been formed upon the integrated circuit microelectronics fabrication a planarized capping inter-metal dielectric (IMD) layer 50. Methods and materials through which planarized inter-metal dielectric (IMD) layers may be formed within integrated circuit microelectronics fabrications are known in the art of integrated circuit microelectronics fabrication. Planarized inter-metal dielectric (IMD) layers may be formed within integrated circuit microelectronics fabrications through methods and materials analogous or equivalent to the methods and materials through which are formed planarized pre-metal dielectric (PMD) layers within integrated circuit microelectronics fabrications.

For the second preferred embodiment of the present invention, the planarized capping inter-metal dielectric (IMD) layer 50 is, similarly with the planarized pre-metal dielectric (PMD) layer 40, preferably formed of a silicon oxide dielectric material formed through a plasma enhanced chemical vapor deposition (PECVD) method, as is common in the art of integrated circuit microelectronics fabrication. Preferably, the planarized capping inter-metal dielectric (IMD) layer 50 so formed is formed to a thickness of from about 3000 to about 20000 angstroms over the integrated circuit microelectronics fabrication whose schematic cross-sectional diagram is illustrated in FIG. 5.

Figure 7:
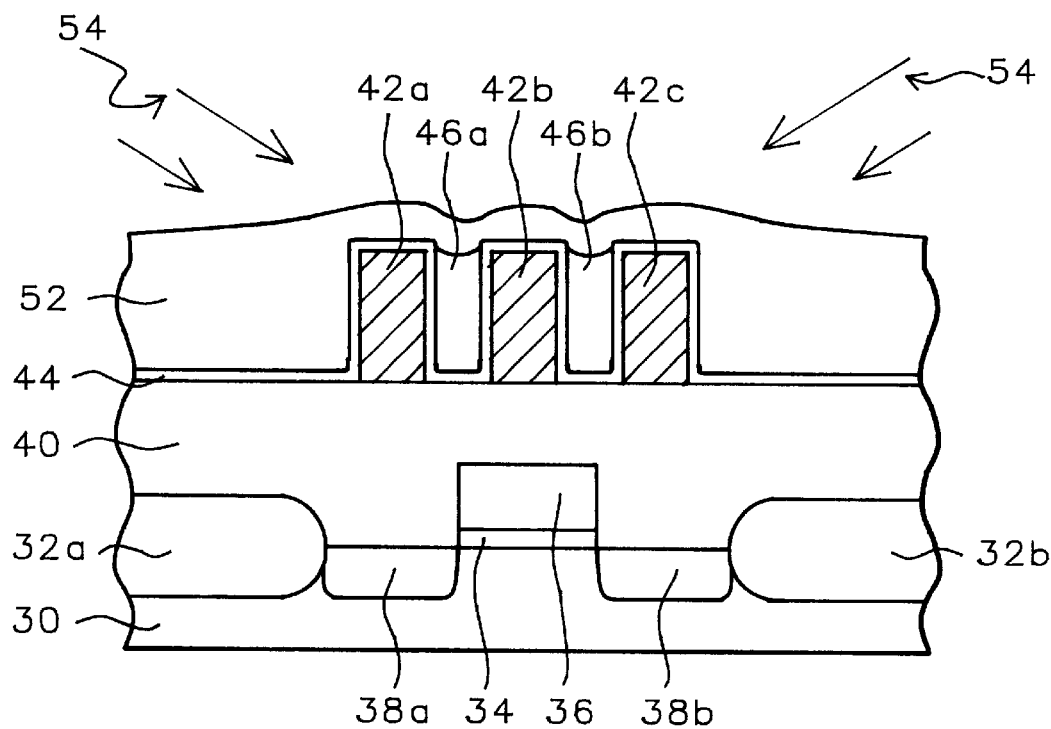

Referring now to FIG. 7, there is shown a schematic cross-sectional diagram illustrating the results of an alternative processing of the integrated circuit microelectronics fabrication whose schematic cross-sectional diagram is illustrated in FIG. 4. Shown in FIG. 7 is a schematic cross-sectional diagram of an integrated circuit microelectronics fabrication otherwise equivalent to the integrated circuit microelectronics fabrication whose schematic cross-sectional diagram is illustrated in FIG. 4, but wherein portions of the gap filling inter-metal dielectric (IMD) layer 46 other than those interposed between the plurality of patterned first conductor layers 42a, 42b and 42c are processed with a grazing angle processing beam 54 to form a processed gap filling inter-metal dielectric (IMD) layer 52 at locations other than those interposed between plurality of patterned first conductor layers 42a, 42b and 42c, while simultaneously forming the patterned gap filling dielectric layers 46a and 46b interposed between the plurality of patterned first conductor layers 42a, 42b and 42c.

Within the integrated circuit microelectronics fabrication whose schematic cross-sectional diagram is illustrated in FIG. 7, where the gap filling inter-metal dielectric (IMD) layer 46 is preferably formed from a organo functional siloxane spin-on-glass (SOG) dielectric material, when the grazing angle processing beam 54 is an electron beam, the portions of the gap filling inter-metal dielectric (IMD) layer 46 other than those interposed between the plurality of patterned first conductor layers 42a, 42b and 42b will typically densify and transform to a silicon oxide dielectric material with dielectric properties and physical properties more closely correlating with the dielectric properties and the physical properties of the conformal first inter-metal dielectric (IMD) layer 44.

Figure 8:
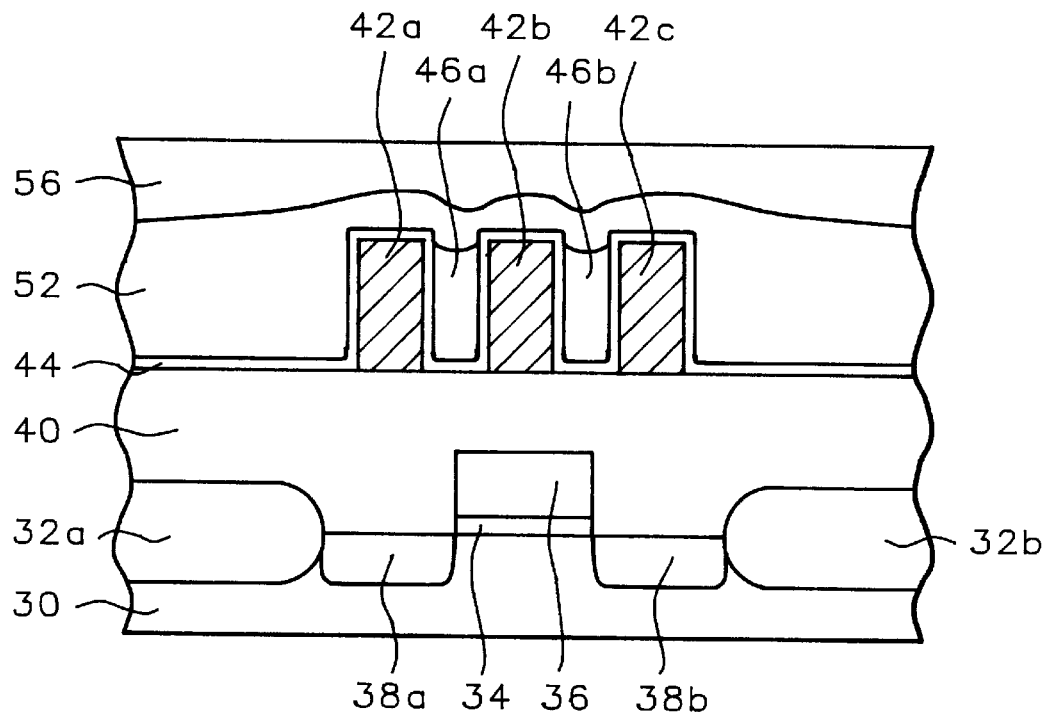

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is a schematic cross-sectional diagram of an integrated circuit microelectronics fabrication otherwise equivalent to the integrated circuit microelectronics fabrication whose schematic cross-sectional diagram is illustrated in FIG. 7, but wherein there is formed upon the integrated circuit microelectronics fabrication a planarized capping inter-metal dielectric (IMD) layer 56. Within the integrated circuit microelectronics fabrication whose schematic cross-sectional diagram is illustrated in FIG. 8, the planarized capping inter-metal dielectric (IMD) layer 56 is preferably formed through methods and materials analogous or equivalent to the methods and materials through which is formed the planarized capping inter-metal dielectric (IMD) layer 50 within the integrated circuit microelectronics fabrication whose schematic cross-sectional diagram is illustrated in FIG. 6.

Upon forming the integrated circuit microelectronics fabrication whose schematic cross-sectional diagram is illustrated in FIG. 6 or FIG. 8, there is formed an integrated circuit microelectronics fabrication having formed therein a plurality of patterned conductor layers having interposed therebetween a low dielectric constant dielectric material while avoiding forming the low dielectric constant dielectric material at a location within the integrated circuit microelectronics fabrication other than interposed between the plurality of patterned conductor layers. While the integrated circuit microelectronics fabrication whose schematic cross-sectional diagram is illustrated in FIG. 6 or FIG. 8 illustrates the plurality of patterned conductor layers as a plurality of patterned first conductor layers, it is understood by a person skilled in the art that the present invention may also be employed in forming selectively interposed between a plurality of patterned upper level conductor layers a second low dielectric constant dielectric material while avoiding forming the second low dielectric constant dielectric material in locations within the integrated circuit microelectronics fabrication other than those interposed between the patterned upper conductor layers.

Apparatus Considerations

Figure 9:
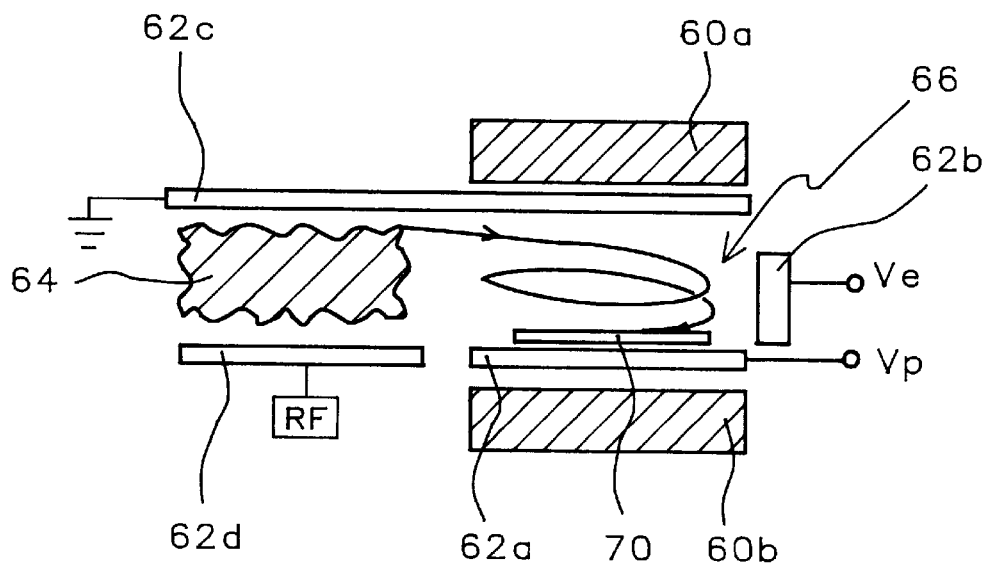
FIG. 9 shows a schematic cross-sectional diagram of an apparatus within which may be formed a grazing angle charged particle beam to be employed within the method of the present invention.

Referring now to FIG. 9, there is shown a schematic cross-sectional diagram of a microelectronics fabrication apparatus which may be employed in fabricating a microelectronics fabrication in accord with the first preferred embodiment of the present invention or an integrated circuit microelectronics fabrication in accord with the second preferred embodiment of the present invention. The microelectronics fabrication apparatus employs a reactor chamber (not shown) having fixed therein a platen electrode 62a upon which is fixed a substrate 70 which may be the substrate 10 employed within the microelectronics fabrication in accord with the first preferred embodiment of the present invention or the semiconductor substrate 30 within the integrated circuit microelectronics fabrication in accord with the second preferred embodiment of the present invention. The platen electrode 62a is maintained at a platen voltage Vp. Parallel and opposite the substrate 70 from the platen electrode 60a is a ground electrode 62c. Fixed at opposite sides of the ground electrode 62c and the platen electrode 62a is a pair of magnets 60a and 60b. Within the microelectronics fabrication apparatus whose schematic cross-sectional diagram is illustrated in FIG. 9, the pair of magnets 60a and 60b provides a magnetic field perpendicular to the substrate 70. Preferably, the magnetic field provided by the pair of magnets 60a and 60b is from about 0.1 to about 5 tesla.

There is also shown in FIG. 9 a radiation beam source 64 which is illustrated in FIG. 9 as a plasma within which there is formed charged particles, although as discussed within the Description of the Preferred Embodiments the radiation beam source may also include an electron beam. As is illustrated in FIG. 9, the radiation beam source 64 illustrated as a plasma is preferably formed through a radio frequency activation of a suitable reactant gas mixture disposed between a radio frequency source electrode 62d and the ground electrode 62c.

Finally, there is shown within FIG. 9 a charged particle beam trajectory 66 resulting from extraction of a charged particle from the radiation beam source 64 assisted by a vertical electrode 62b maintained at an extraction voltage Ve. As is illustrated in FIG. 9, due to the magnetic field produced by the pair of magnets 60a and 60b, the charged particle beam trajectory 66 winds remote radiation beam source 64 and towards the substrate 70 provided the polarity of the platen electrode 62a is of polarity opposite the polarity of the particles within the charged particle beam and that appropriate conditions of the platen voltage Vp and the extraction voltage Ve exist. The incident angle of the charged particle beam trajectory 66 upon the substrate 70 is determined by the ratio of the extraction voltage Ve to the platen voltage Vp. The incident angle of the charged particle beam trajectory 66 is neither parallel nor perpendicular to the magnetic field which is perpendicular to the substrate 70

As relates to a charged particle within the charged particle beam trajectory 66, for a single charged particle of charge q and velocity v within a uniform magnetic field B, the Lorentz force F experienced by the particle may be determined through classical electromagnetic considerations (see, for example, Kraus et al., Electromagnetics, 2nd edition, McGraw-Hill (1973), pg 719), as is shown by equation 1.

$$F = q(v \times B) \quad (1)$$

Similarly, the radius of motion R of the particle is similarly determined by analogous classical considerations and is given by equation 2.

$$R = (m \times v_{perp})/(q \times B) \quad (2)$$

Within equation 2, $v_{perp}$ is the velocity vector component of the particle perpendicular to the mangetic field B and m is the mass of the particle. For a singly charged particle having a perpendicular velocity component equivalent to 50 eV and a mass equal to the mass of a proton, the radius of motion as calculated through equation 2 equals 0.244 centimeters. Commensurate increases or decreases in magnetic field strength or perpendicular velocity vector component are required to spirally magnetically constrain lighter or heavier charged particles within the dimensional limits of conventional reactor chambers and microelectronics substrates.

What is claimed is:

1. A method for fabricating a microelectronics fabrication comprising:

providing a substrate employed within a microelectronics fabrication;

forming horizontally spaced over the substrate a plurality of patterned microelectronics structures;

forming over the substrate and the plurality of patterned microelectronics structures a microelectronics layer, the microelectronics layer having a first region of the microelectronics layer interposed between the plurality of patterned microelectronics structures and a second region of the microelectronics layer not interposed between the plurality of patterned microelectronics structures; and processing through a grazing angle method the microelectronics layer, where the grazing angle method processes substantially all of the second region of the microelectronics layer without substantially processing the first region of the microelectronics layer, wherein:

the grazing angle method employs a grazing angle charged particle beam formed by extraction of charged particles from a radiation beam source remote from the substrate; and the grazing angle charged particle beam is spirally constrained within the vicinity of the substrate by an extrinsic magnetic field substantially perpendicular to the substrate.

2. The method of claim 1 wherein the microelectronics fabrication is chosen from the group of microelectronics fabrications consisting of integrated circuit microelectronics fabrications, solar cell microelectronics fabrications ceramic substrate microelectronics fabrications and flat panel display microelectronics fabrications.

3. The method of claim 1 wherein the plurality of microelectronics structures is formed from a material chosen from the group of materials consisting of conductor materials, semiconductor materials and insulator materials.

4. The method of claim 1 wherein the microelectronics layer is formed from a material chosen from the group of materials consisting of conductor materials, semiconductor materials and insulator materials.

5. The method of claim 1 wherein the grazing angle charged particle beam selectively etches and removes substantially all of the second region of the microelectronics layer without substantially etching or removing the first region of the microelectronics layer.

6. The method of claim 1 wherein the grazing angle charged particle beam selectively irradiates and transforms substantially all of the second region of the microelectronics layer without substantially irradiating or transforming the first region of the microelectronics layer.

7. The method of claim 1 wherein the grazing angle charged particle beam is incident to the magnetic field in the vicinity of the substrate neither perpendicular nor parallel to the magnetic field.

8. A method for fabricating an integrated circuit microelectronics fabrication comprising:

providing a semiconductor substrate;

forming over the semiconductor substrate a patterned conductor layer, the patterned conductor layer having a first region having plurality of horizontally closely spaced patterns formed therein and a second region not having the plurality of horizontally closely spaced patterns formed therein;

forming over the substrate and the patterned conductor layer a low dielectric constant dielectric layer, the low dielectric constant dielectric layer having a first region of the low dielectric constant dielectric layer interposed between the plurality of horizontally closely spaced patterns within the first region of the patterned conductor layer and a second region of the low dielectric constant dielectric layer not interposed between the plurality of horizontally closely spaced patterns within the first region of the patterned conductor layer; and processing through a grazing angle method the low dielectric constant dielectric layer, where the grazing angle method processes substantially all of the second region of the low dielectric constant dielectric layer without substantially processing the first region of the low dielectric constant dielectric layer, wherein:

the grazing angle method employs a grazing angle charged particle beam formed by extraction of charged particles from a radiation beam source remote from the substrate; and the grazing angle charged particle beam is spirally constrained within the vicinity of the substrate by an extrinsic magnetic field substantially perpendicular to the substrate.

9. The method of claim 8 wherein the grazing angle charged particle beam selectively etches and removes substantially all of the second region of the low dielectric constant dielectric layer without substantially etching or removing the first region of the low dielectric constant dielectric layer.

10. The method of claim 8 wherein the grazing angle charged particle beam selectively irradiates and transforms substantially all of the second region of the low dielectric constant dielectric layer without substantially irradiating or transforming the first region of the low dielectric constant dielectric layer.

11. The method of claim 8 wherein the grazing angle charged particle beam is incident to the magnetic field in the vicinity of the substrate neither perpendicular nor parallel to the magnetic field.

* * * * *